United States Patent
Jung

(10) Patent No.: US 9,461,634 B2
(45) Date of Patent: Oct. 4, 2016

(54) DATA OUTPUT CIRCUIT OF SEMICONDUCTOR APPARATUS

(71) Applicant: SK hynix Inc., Icheon-si Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 155 days.

(21) Appl. No.: 14/309,692

(22) Filed: Jun. 19, 2014

(65) Prior Publication Data

US 2015/0249443 A1 Sep. 3, 2015

(30) Foreign Application Priority Data

Mar. 3, 2014 (KR) ........................ 10-2014-0024876

(51) Int. Cl.
*H03K 5/12* (2006.01)
*H03K 5/01* (2006.01)

(52) U.S. Cl.
CPC ...................... *H03K 5/01* (2013.01)

(58) Field of Classification Search
CPC ........................................ H03K 5/01
USPC ........................................ 327/170
See application file for complete search history.

(56) References Cited

U.S. PATENT DOCUMENTS

| 5,111,075 A * | 5/1992 | Ferry ............... H03K 19/00361 326/27 |
| 5,231,311 A * | 7/1993 | Ferry ............... H03K 19/00361 326/27 |
| 6,452,428 B1 * | 9/2002 | Mooney ............... H03K 17/164 326/30 |
| 7,154,315 B2 * | 12/2006 | Kim ..................... H03K 17/164 327/170 |
| 7,777,538 B2 * | 8/2010 | Abel ........................ H03K 5/01 326/93 |
| 8,717,080 B2 * | 5/2014 | Ferguson ............... H03K 5/133 327/261 |
| 2010/0085098 A1 * | 4/2010 | Ferguson ............... H03K 5/133 327/264 |
| 2012/0133393 A1 * | 5/2012 | Matsuoka ........ H03K 19/01758 326/83 |
| 2013/0147532 A1 * | 6/2013 | Song .................. H03K 19/0027 327/170 |
| 2014/0176197 A1 * | 6/2014 | Shon ........................ H03K 3/01 327/108 |

FOREIGN PATENT DOCUMENTS

KR 1020100030226 A 3/2010

* cited by examiner

*Primary Examiner* — Ryan Jager
(74) *Attorney, Agent, or Firm* — William Park & Associates Ltd.

(57) ABSTRACT

A data output circuit of a semiconductor apparatus may include a first driver coupled to an output terminal via a first node, a second driver coupled to the output terminal via a second node and a controller coupled to the first and second drivers and configured to adjust a slew rate of a data signal output via the output terminal.

13 Claims, 4 Drawing Sheets

DATA OUTPUT CIRCUIT OF SEMICONDUCTOR APPARATUS

CROSS-REFERENCES TO RELATED APPLICATION

The present application claims priority under 35 U.S.C. §119(a) to Korean application number 10-2014-0024876, filed on Mar. 3, 2014, in the Korean Intellectual Property Office, which is incorporated herein by reference in its entirety.

BACKGROUND

1. Technical Field

Various embodiments relate to a semiconductor apparatus, and more particularly, to a data output circuit of a semiconductor apparatus.

2. Related Art

A semiconductor apparatus typically includes a data output circuit configured to output data stored in an internal memory block via an input/output pad DQ in response to an external data output command received from a device external to the semiconductor apparatus. An example of an external data output command is a read command.

The data output via the data output circuit may have slew rates that vary depending on the operating environment of the semiconductor apparatus. For example, the slew rate may vary based on the type of system coupled to the semiconductor apparatus.

SUMMARY

In an embodiment, a data output circuit of a semiconductor apparatus may include a first driver electrically coupled to an output terminal via a first node, a second driver electrically coupled to the output terminal via a second node, and a controller electrically coupled to the first and second drivers and configured to adjust a slew rate of a data signal output via the output terminal by varying an activation timing difference between the first and second drivers.

In an embodiment, a data output circuit of a semiconductor apparatus may include a first driver leg group electrically coupled to an output terminal via a first node, a second driver leg group electrically coupled to the output terminal via a second node, and a controller electrically coupled to the first and second leg groups and configured to activate the first driver leg group at a first time and to activate the second driver leg group at a second time, wherein the second time is a time period following the first time, and to adjust a slew rate of a data signal output via the output terminal by varying the time period.

In an embodiment, a data output circuit of a semiconductor apparatus may include first and second sub drivers electrically coupled to an output terminal and configured to have an activation resistance value based on a preset impedance value of the output terminal, and a controller electrically coupled to the first and second sub drivers and configured to adjust a slew rate of a data signal output via the output terminal by varying an activation timing difference between the first and second sub drivers.

DETAILED DESCRIPTION

Various embodiments of a data output circuit of a semiconductor apparatus will be described below with reference to the accompanying drawings.

Figure 1:
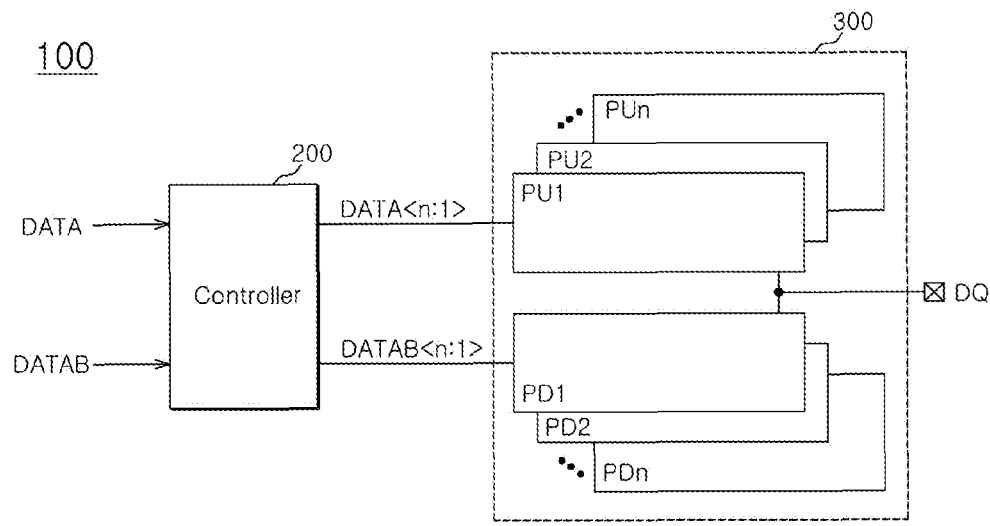
FIG. 1 is a block diagram representation of an embodiment of a data output circuit of a semiconductor apparatus.

Referring to FIG. 1, an embodiment of a data output circuit 100 of a semiconductor apparatus may include a driver 300 and a controller 200.

The driver 300 may include a pull-up driver leg group PU1-PUn and a pull-down driver leg group PD1-PDn.

The pull-up driver leg group PU1-PUn and the pull-down driver leg group PD1PDn may be electrically coupled to an input/output pad DQ.

The pull-up driver leg group PU1-PUn may be configured to drive the input/output pad DQ to a power supply voltage level in response to a control signal DATA<n:1>.

The pull-up driver legs PU1-PUn in the pull-up driver leg group PU1-PUn may be sequentially activated in response to the control signal DATA<n:1>. The sequential activation of the pull-up driver legs PU1-PUn may adjust the slew rate of a signal driven to the input/output pad DQ.

Each pull-up driver leg of the pull-up driver leg group PU1-PUn may receive a corresponding signal bit of the control signal DATA<n:1>.

For example, the pull-up driver leg PU1 may receive the control signal bit DATA1, and the pull-up driver leg PUn may receive the control signal bit DATAn.

The pull-down driver leg group PD1-PDn may be configured to drive the input/output pad DQ to a ground voltage level in response to a control signal DATAB<n:1>.

The pull-down driver legs PD1-PDn in the pull-down driver leg group PD1-PDn may be sequentially activated in response to the control signal DATAB<n:1>. The sequential activation of the pull-down driver legs PD1-PDn may adjust the slew rate of a signal driven to the input/output pad DQ.

Each pull-down driver leg of the pull-down driver leg group PD1-PDn may receive a corresponding signal bit of the control signal DATAB<n:1>.

For example, the pull-down driver leg PD1 may receive the control signal bit DATAB1, and the pull-down driver leg PDn may receive the control signal bit DATABn.

The driver 300 may change one or more bits of the control signals DATA<n:1>, DATAB<n:1> to an inactive level based on a preset driving impedance value, thereby adjusting the number of driver legs that are activated.

For example, the number of driver legs associated with the value of the preset driving impedance may be five (PU1-PU5 or PD1-PD5) and the total number of driver legs in each driver leg group may be, for example, six. When the total number of driver legs in each driver leg group is six, n has a value of 6. The six pull-up driver legs include PU1-PU6 and the six the pull-down driver legs include PD1-PD6.

When the number of driver legs associated with the value of the preset driving impedance is five, the pull-up driver leg PU6 and the pull-down driver leg PD6 may change the control signal bits DATA6 and DATAB6 to the inactive level. The control signal bits DATA6 and DATAB6 may be changed to an inactive level and the activation of the pull-up driver leg PU6 and the pull-down driver leg PD6 may be blocked. The control signal bits DATA6 and DATAB6 may be changed to an inactive level regardless of the values of the inputs received at the pull-up driver leg PU6 and the pull-down driver leg PD6.

The controller 200 may be configured to generate the control signal DATA<n:1> and DATAB<n:1> in response to data signal DATA and data bar signal DATAB, respectively.

The data signal DATA and the data bar signal DATAB may include differential data having the opposite phases.

Figure 2:
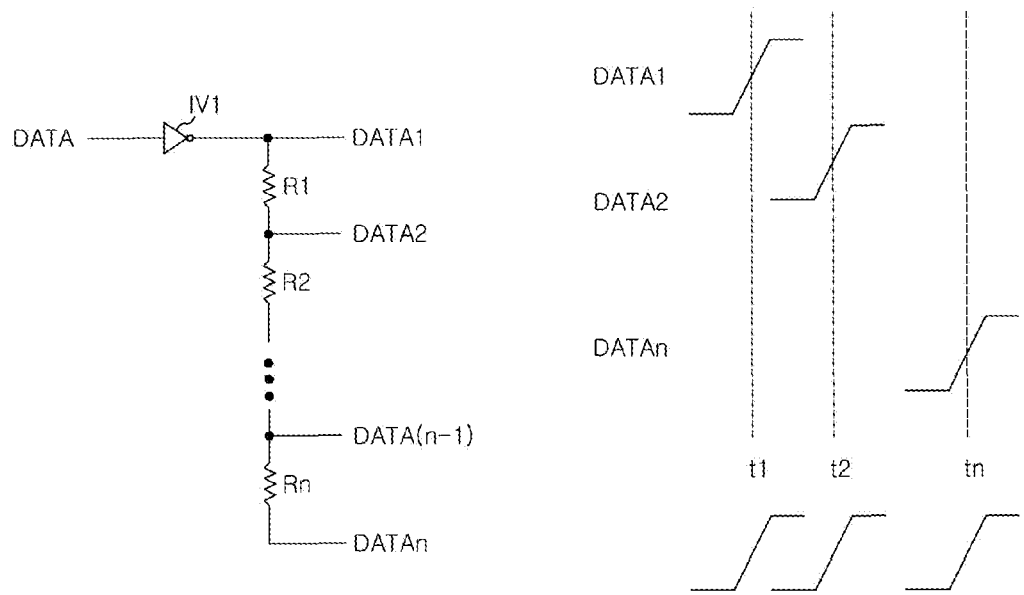
FIG. 2 is a circuit diagram representation of a configuration of a controller of FIG. 1.

Referring to FIG. 2, the controller 200 may include an inverter IV1 and a plurality of resistors R1-Rn.

The inverter IV1 may receive data signal DATA as an input and generated an inverted data signal DATA.

The plurality of resistors R1-Rn may receive the inverted data signal DATA as an input and sequentially delay the received output of the inverter IV1 to generate the control signal DATA<n:1>.

Each of the bits of the control signal DATA<n:1> may have a different output time t1-tn with respect to each other.

The controller 200 may include a second circuit (not shown) having a substantially similar configuration as the circuit shown in FIG. 2. The second circuit may receive the data bar signal DATAB as an input and generate the control signal DATAB<n:1> as an output. The second circuit may sequentially delay the output of the individual bits of the control signal DATAB<n:1>.

The pull-up driver leg group PU1-PUn may be sequentially activated in response to the control signal DATA<n:1>, where individual bits of the control signal DATA<n:1> may each have a different output time t1-tn. The pull-down driver leg group PD1-PDn may be sequentially activated in response to the control signal DATAB<n:1>, where individual bits of the control signal DATAB<n:1> may each have a different output time t1-tn.

Each of the pull-up driver legs in the pull-up driver leg group PU1-PUn and each of the pull-down driver legs in the pull-down driver leg group PD1-PDn may be sequentially activated to adjust the slew rate of output data. The output data may be a signal driven to the input/output pad DQ.

Figure 3:
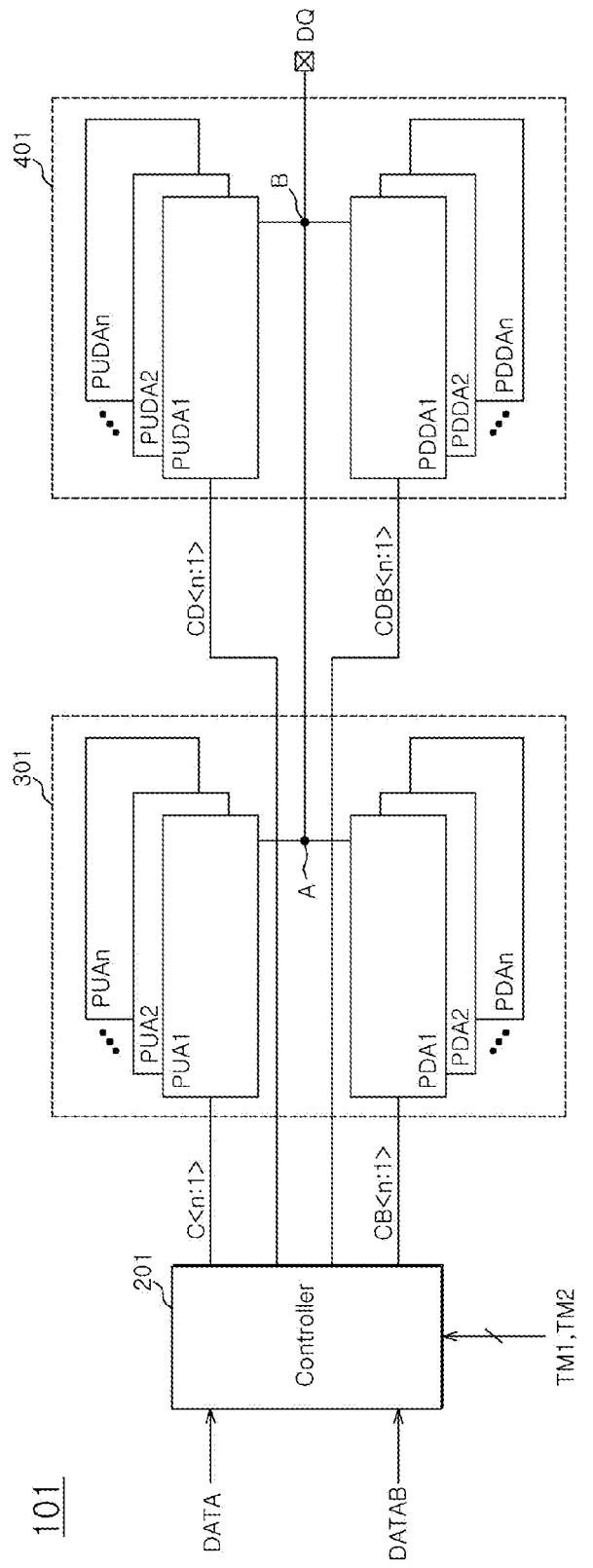
FIG. 3 is a block diagram representation of an embodiment of a data output circuit of a semiconductor apparatus.

Referring to FIG. 3, an embodiment of a data output circuit 101 of a semiconductor apparatus may include a first driver 301, a second driver 401, and a controller 201.

The first and second drivers 301, 401 may correspond to first and second sub drivers, where the first and second sub drivers are obtained by separating a single driver into two sub drivers.

The data output circuit 101 may, for example, include an input/output pad DQ having a preset impedance value of 34Ω. The impedance value may be set using a resistance value Ron of a driver electrically coupled to the input/output pad DQ.

The resistance value Ron of the driver 301, 401 may be set based on a sum of the resistance values of the pull-up driver legs or a sum of the resistance values of the pull-down driver legs that have been activated in response to the data signals DATA/DATAB.

An embodiment of the data output circuit 101 of the semiconductor apparatus may be configured to adjust the slew rate of output data by varying an activation timing difference between the first and second drivers 301, 401, based on first control signals C<n:1>, CB<n:1> and second control signals CD<n:1>, CDB<n:1>.

An embodiment of the data output circuit 101 of the semiconductor apparatus may be configured to activate the driver legs of the first driver 301 in response to the first control signals C<n:1>, CB<n:1>, and to activate the driver legs of the second driver 401 in response to the second control signals CD<n:1>, CDB<n:1> at different preset times and may adjust the slew data of output data.

The first driver 301 may include a first pull-up driver leg group PUA1-PUAn and a first pull-down driver leg group PDA1-PDAn.

The first pull-up driver leg group PUA1-PUAn may be commonly electrically coupled to the input/output pad DQ via a first node A.

The first pull-up driver leg group PUA1-PUAn may be configured to drive the input/output pad DQ to a power supply voltage level in response to the first control signal C<n:1>.

Each of the pull-up driver legs of the first pull-up driver leg group PUA1-PUAn may receive a corresponding signal bit of the first control signal C<n:1>.

For example, the pull-up driver leg PUA1 may receive the first control signal bit C1, and the pull-up driver leg PUAn may receive the first control signal bit Cn.

The first pull-down driver leg group PDA1-PDAn may be commonly electrically coupled to the input/output pad DQ via the first node A.

The first pull-down driver leg group PDA1-PDAn may be configured to drive the input/output pad DQ to a ground voltage level in response to the first control signal CB<n:1>.

Each pull-down driver leg of the first pull-down driver leg group PDA1-PDAn may receive a corresponding signal bit of the first control signal CB<n:1>.

For example, the pull-down driver leg PDA1 may receive the first control signal bit CB1 and the pull-down driver leg PDAn may receive the first control signal bit CBn.

The second driver 401 may include a second pull-up driver leg group PUDA1-PUDAn and a second pull-down driver leg group PDDA1-PDDAn.

The second pull-up driver leg group PUDA1-PUDAn may be commonly electrically coupled to the input/output pad DQ via a second node B.

The second pull-up driver leg group PUDA1-PUDAn may be configured to drive the input/output pad DQ to the power supply voltage level in response to the second control signal CD<n:1>.

Each pull-up driver leg of the second pull-up driver leg group PUDA1-PUDAn may receive a corresponding signal bit of the second control signal CD<n:1>.

For example, the pull-up driver leg PUDA1 may receive the second control signal bit CD1, and the pull-up driver leg PUDAn may receive the second control signal bit CDn.

The second pull-down driver leg group PDDA1-PDDAn may be commonly electrically coupled to the input/output pad DQ via the second node B.

The second pull-down driver leg group PDDA1-PDDAn may be configured to drive the input/output pad DQ to the ground voltage level in response to the second control signal CDB<n:1>.

Each pull-down driver leg of the second pull-down driver leg group PDDA1-PDDAn may receive a corresponding signal bit of the second control signal CDB<n:1>.

For example, the pull-down driver leg PDDA1 may receive the second control signal bit CDB1, and the pull-down driver leg PDDAn may receive the second control signal bit CDBn.

The first driver 301 may change one or more bits of the first control signals C<n:1>, CB<n:1> to an inactive level based on a preset driving impedance value, and adjust the number of legs that are activated. The second driver 401 may change one or more bits of the second control signals CD<n:1>, CDB<n:1> to an inactive level based on a preset driving impedance value, and adjust the number of driver legs that are activated.

For example, the number of driver legs associated with the preset driving impedance may be two (PUA1-PUA2, PDA1-PDA2, PUDA1-PUDA2, or PDDA1-PDDA2) and the total number of driver legs in each driver leg group may be, for example, three. When the total number of driver legs in each driver leg group is three, n has a value of 3. The first driver 301 includes the first pull-up driver leg group PUA1-PUA3 and the first pull-down driver leg group PDA1-PDA3. The three pull up driver legs in the first pull-up driver leg group include PUA1-PUA3 and the three pull-down driver legs in the first pull-down driver leg group include PDA1 to PDA3. The second driver 401 includes the second pull-up driver leg group PUDA1-PUDA3 and the second pull-down driver leg group PDDA1-PDDA3. The three pull-up driver legs in the second pull-up driver leg group include PUDA1-PUDA3 and the three pull-down driver legs in the second pull-down driver leg group include PDDA1-PDDA3.

When the number of driver legs associated with the value of the preset driving impedance is two, the pull-up driver leg PUA3 may change the control signal bit C3 to an inactive level, the pull-down driver leg PDA3 may change the control signal bit CB3 to an inactive level, the pull-up drive leg PUDA3 may change the control signal bit CD3 to an inactive level, and the pull-down driver leg PDDA3 may change the control signal bit CDB3 to an inactive level. The control signal bits C3, CB3, CD3, CDB3 may be changed to an inactive level and the activation of the driver legs PUA3, PDA3, PUDA3, PDDA3 may be blocked. The control signal bits C3, CB3, CD3, CDB3 may be changed to an inactive level regardless of the values of the inputs received at the driver legs PUA3, PDA3, PUDA3, PDDA3.

The controller 201 may be configured to vary an activation timing difference between the first control signal C<n:1> or CB<n:1> and the second control signal CD<n:1> or CDB<n:1> in response to first and second test signals TM1, TM2, data signal DATA, and data bar signal DATAB.

The data signal DATA and the data bar signal DATAB may include differential data having the opposite phases.

Figure 4:
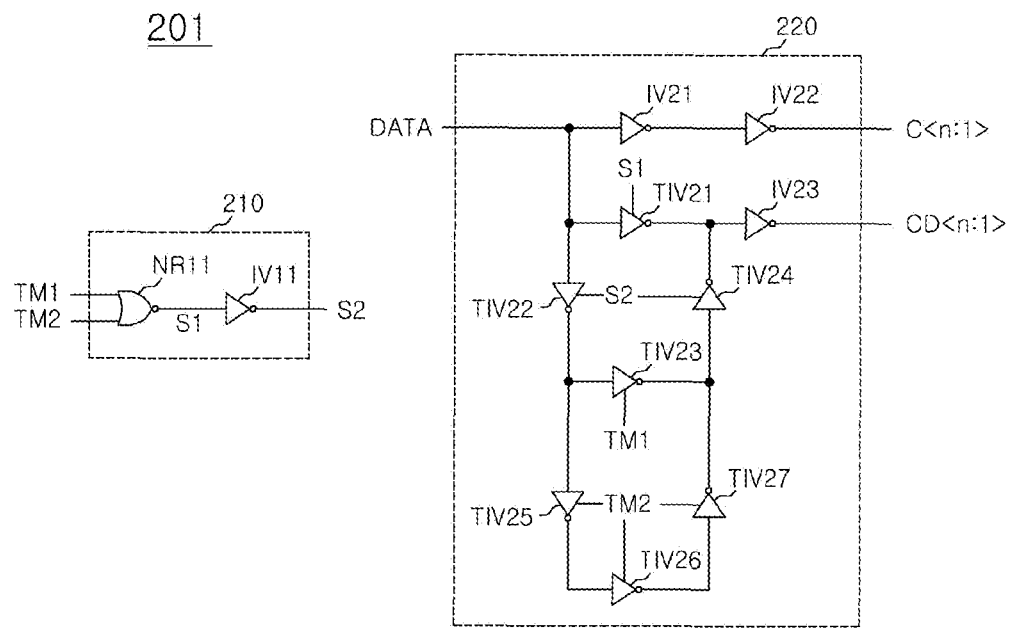
FIG. 4 is a circuit diagram representation of a configuration of a controller of FIG. 3.
Figure 4:
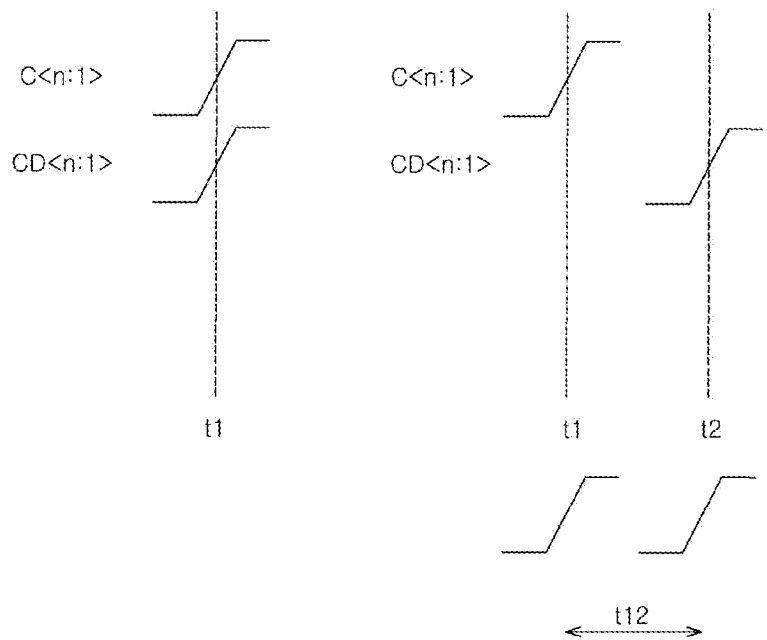

Referring to FIG. 4, the controller 201 may include a select signal generation unit 210 and a signal path changing unit 220.

The select signal generation unit 210 may be configured to generate first and second select signals S1, S2 in response to the first and second test signals TM1, TM2.

The select signal generation unit 210 may include a NOR gate NR11 and an inverter IV11.

The NOR gate NR11 may receive the first and second test signals TM1, TM2 as inputs. The NOR gate NR11 may generate the first select signal S1 by performing a NOR operation on the received first and second test signals TM1, TM2.

The NOR gate NR11 may generate a first select signal S1 activated to a logic high level when the received first and second test signals TM1, TM2 are deactivated to a logic low level.

The inverter IV11 may receive the first select signal S1 as an input and generate an inverted first select signal S1 as the second select signal S2.

The inverter IV11 may generate a second select signal S2 activated to a logic high level when at least one of the first and second test signals TM1, TM2 is activated to a logic high level.

The signal path changing unit 220 may include a plurality of inverters IV21-IV23 and a plurality of tri-state inverters TIV21-TIV27.

The signal path changing unit 220 may include a plurality of signal paths. In an embodiment, the signal changing unit 220 may include first, second, third and fourth signal paths.

The first signal path may include the plurality of inverters IV21-IV22. The first signal path may buffer the data signal DATA regardless of the state of the first and second select signals S1, S2, and output the buffered data as the first control signal C<n:1>.

The second signal path may include the tri-state inverter TIV21 and the inverter IV23. The second signal path may output the data signal DATA as the second control signal CD<n:1> when the first select signal S1 is activated.

The third signal path may include the plurality of tri-state inverters TIV22-TIV24 and the inverter IV23. The third signal path may and output the data signal DATA as the second control signal CD<n:1> when the first test signal TM1 is activated.

The fourth signal path may include the plurality of tri-state inverters TIV22, TIV25, TIV26, TIV27, TIV24 and the inverter IV23. The fourth signal path may output the data signal DATA as the second control signal CD<n:1> when the second test signal TM2 is activated.

The first and second signal paths may delay the data signal DATA by substantially the same delay time period where the delay time period is a first delay time period. The third signal path may delay the data signal DATA by a second delay time period. The fourth signal path may delay the data signal DATA by a third delay time period.

The first delay time period may be relatively longer than the second delay time period. The second delay time period may be relatively longer than the third delay time period.

A second circuit (not shown), having substantially the same configuration as the circuit shown in FIG. 4, may generate the first control signal CB<n:1> and the second control signal CD<n:1> using the data bar signal DATAB.

When a test mode is deactivated, the first and second test signals TM1, TM2 are deactivated and the first control signal CB<n:1> and the second control signal CD<n:1> may have substantially the same activation timing.

When the test mode is activated, at least one of the first and second test signals TM1, TM2 is activated and the activation timings associated with the first control signal C<n:1> may be different with respect to the activation timings associated with the second control signal CD<n:1> and the activation timing difference therebetween may be varied.

When the second test signal TM2 is activated, the activation timing difference between the first control signal C<n:1> and the second control signal CD<n:1> may be set to a relatively larger value than when the first test signal TM1 is activated.

When the first test signal TM1 is activated, the activation timing difference between the first control signal C<n:1> and the second signal CD<n:1> may be set to a relatively smaller value than when the second test signal TM2 is activated.

The above-described configuration is an illustrative example using the first and second test signals TM1, TM2. Additional test signals may be used to increase the range of the activation timing differences between the first control signal C<n:1> and the second signal CD<n:1>.

Embodiments of the data output circuit 101 of the semiconductor apparatus may vary the activation timing difference between the first control signal C<n:1> or CB<n:1> and the second signal CD<n:1> or CBD<n:1> to vary the activation timing difference between the first and second drivers 301, 401 and may adjust the slew rate of the output data to the input/output pad DQ to a desired level.

Embodiments of the data output circuit of the semiconductor apparatus may adjust a slew rate.

Figure 5:
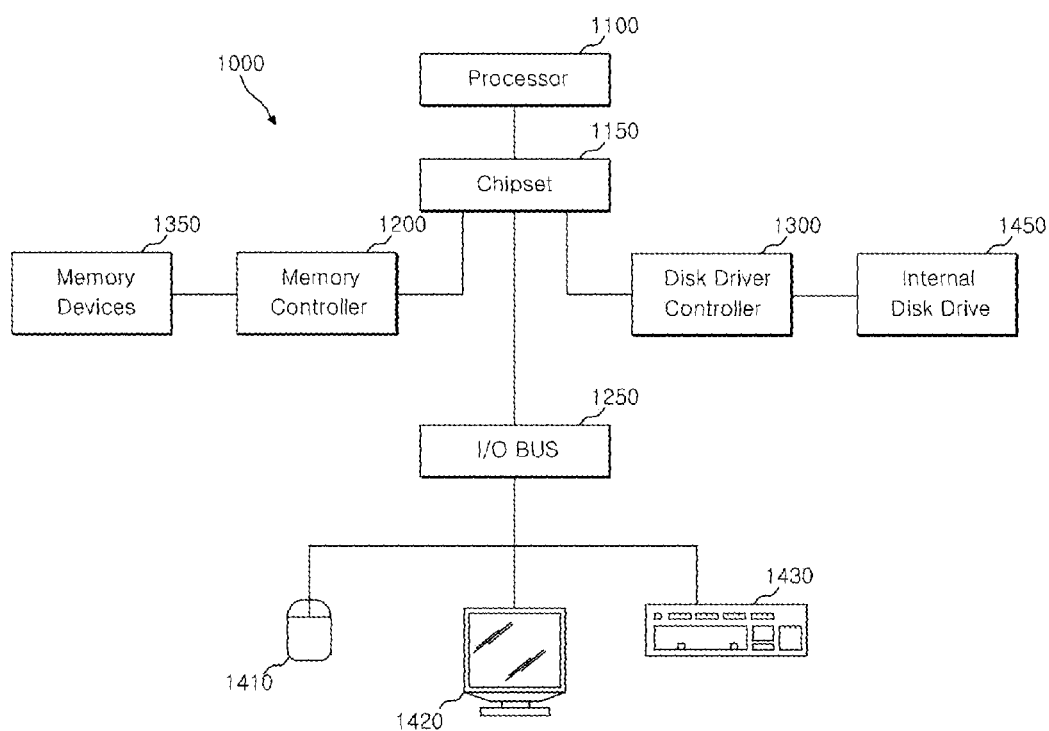
FIG. 5 is a block diagram representation of system including a semiconductor apparatus including an embodiment of a data output circuit.

Referring to FIG. 5, a block diagram representation of a system 1000 including an embodiment of a semiconductor apparatus 1350 is shown. In an embodiment, the semiconductor apparatus 1350 is a semiconductor memory device 1350. In an embodiment the semiconductor apparatus 1350 includes an embodiment of the data output circuit.

In an embodiment, a data output circuit of a semiconductor apparatus 1350 may include a first driver electrically coupled to an output terminal via a first node, a second driver electrically coupled to the output terminal via a second node and a controller electrically coupled to the first and second drivers and configured to adjust a slew rate of a data signal output via the output terminal.

In an embodiment, a data output circuit of a semiconductor apparatus 1350 may include a first driver leg group electrically coupled to an output terminal via a first node, a second driver leg group electrically coupled to the output terminal via a second node, and a controller electrically coupled to the first and second leg groups and configured to activate the first driver leg group at a first time and to activate the second driver leg group at a second time, wherein the second time is a time period following the first time, and to adjust a slew rate of a data signal output via the output terminal by varying the time period.

In an embodiment, a data output circuit of a semiconductor apparatus 1350 may include first and second sub drivers electrically coupled to an output terminal and configured to have an activation resistance value based on a preset impedance value of the output terminal, and a controller electrically coupled to the first and second sub drivers and configured to adjust a slew rate of a data signal output via the output terminal by varying an activation timing difference between the first and second sub drivers.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 5 is merely one example of a system employing a semiconductor memory device 1350. In alternate embodiments, such as cellular phones or digital cameras, the components may differ from the embodiment shown in FIG. 5.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A data output circuit of a semiconductor apparatus, comprising:
   a first driver coupled to an output terminal and activated according to a first control signal;
   a second driver coupled to the output terminal and activated according to a second control signal; and
   a controller coupled to the first and second drivers and configured to generate the first control signal and the second control signal for activating the first driver and the second driver with a time difference in response to a data signal and to activation of a test mode,
   wherein the controller comprises:
   a select signal generation unit configured to generate a plurality of select signals according to the test mode; and
   a plurality of signal paths configured to delay the data signal by different delay times in response to the plurality of select signals and to output the delayed data signal as the first and second control signals.

2. The data output circuit according to claim 1, wherein the controller is configured to generate the first and second control signals operable to activate the first and second drivers at substantially the same time in response to deactivation of the test mode.

3. The data output circuit according to claim 1, wherein when the test mode is deactivated, the plurality of signal paths are configured to delay the data signal by substantially the same delay time and output the delayed data signal as the first and second control signals.

4. The data output circuit according to claim 1, wherein the first driver comprises:
   a pull-up driver leg group configured to drive the output terminal to a power supply voltage level in response to the first control signal; and
   a pull-down driver leg group configured to drive the output terminal to a ground voltage level in response to the first control signal.

5. The data output circuit according to claim 1, wherein the second driver comprises:
   a pull-up driver leg group configured to drive the output terminal to the power supply voltage level in response to the second control signal; and
   a pull-down driver leg group configured to drive the output terminal to the ground voltage level in response to the second control signal.

6. A data output circuit of a semiconductor apparatus, comprising:
   a first driver leg group coupled to an output terminal and activated according to a first control signal;
   a second driver leg group coupled to the output terminal and activated according to a second control signal; and
   a controller coupled to the first and second driver leg groups and configured to generate the first control signal for activating the first driver leg group at a first time, and generate the second control signal for activating the second driver leg group at a second time, wherein the second time is a time period following the first time, and to adjust a slew rate of a data signal output via the output terminal by varying the time period in response to the data signal and to activation of a plurality of test signals,
   wherein the controller comprises:
   a select signal generation unit configured to generate a plurality of select signals in response to the plurality of test signals;
   a first signal path configured to buffer the data signal and to output the buffered data signal as the first control signal;
   a second signal path configured to buffer the data signal in response to a first one of the plurality of select signals and to output the buffered data signal as the second control signal; and
   a plurality of signal paths configured to vary the time period in response to a second one of the plurality of select signals and to the plurality of test signals and to output the second control signal.

7. The data output circuit according to claim 6, wherein the controller is configured to generate the first and second control signals operable to activate the first and second driver groups at substantially the same timing in response to deactivation of the plurality of test signals.

8. The data output circuit according to claim 6, wherein the second signal path is configured to buffer the data signal and to output the buffered data signal as the second control signal when the plurality of test signals are deactivated.

9. A data output circuit of a semiconductor apparatus, comprising:
   first and second sub drivers coupled to an output terminal and configured to have an activation resistance value based on a preset impedance value of the output terminal and activated according to a first control signal and a second control signal; and
   a controller coupled to the first and second sub drivers and configured to generate the first control signal and the second control signal for activating the first driver and the second driver with a time difference in response to a data signal and to activation of a test mode,
   wherein the controller comprises:
   a select signal generation unit configured to generate a plurality of select signals according to the test mode; and
   a plurality of signal paths configured to delay the data signal by different delay times in response to the plurality of select signals and to output the delayed data signal as the first and second control signals.

10. The data output circuit according to claim 9, wherein the controller is configured to generate the first and second control signals operable to activate the first and second sub drivers at substantially the same time in response to deactivation of the test mode.

11. The data output circuit according to claim 9, wherein when the test mode is deactivated, the plurality of signal paths are configured to delay the data signal by substantially the same delay time and to output the delayed data signal as the first and second control signals.

12. The data output circuit according to claim 9, wherein the first sub driver comprises:
   a pull-up driver leg group configured to drive the output terminal to a power supply voltage level in response to the first control signal; and
   a pull-down driver leg group configured to drive the output terminal to a ground voltage level in response to the first control signal.

13. The data output circuit according to claim 9, wherein the second sub driver comprises:
   a pull-up driver leg group configured to drive the output terminal to the power supply voltage level in response to the second control signal; and
   a pull-down driver leg group configured to drive the output terminal to the ground voltage level in response to the second control signal.

* * * * *